(12) United States Patent
Flaibani et al.

(10) Patent No.: US 10,601,318 B2
(45) Date of Patent: Mar. 24, 2020

(54) SWITCHING CONVERTER USING PULSE-FREQUENCY MODULATION AND CURRENT-MODE CONTROL

(71) Applicant: Infineon Technologies AG, Neubiberg (DE)

(72) Inventors: Marco Flaibani, Montegrotto Terme (IT); Stefano Orlandi, San Bonifacio (IT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/259,664

(22) Filed: Jan. 28, 2019

(65) Prior Publication Data

US 2019/0238054 A1    Aug. 1, 2019

(30) Foreign Application Priority Data

Jan. 29, 2018   (DE) .......................... 10 2018 101 932

(51) Int. Cl.
*H02M 3/158* (2006.01)
*H02M 3/156* (2006.01)
(Continued)

(52) U.S. Cl.
CPC ........... *H02M 3/156* (2013.01); *H02M 3/158* (2013.01); *H03K 7/06* (2013.01); *H02M 2001/0009* (2013.01); *H02M 2001/0032* (2013.01)

(58) Field of Classification Search
CPC ................ H02M 3/156; H02M 3/158; H02M 2003/156; H02M 2003/158;
(Continued)

(56) References Cited

U.S. PATENT DOCUMENTS 7,230,406 B2 * 6/2007 Huang .................. H02M 3/158
                                                                          323/222
7,728,567 B1    6/2010 Mack
(Continued)

FOREIGN PATENT DOCUMENTS

| DE | 102011088654 A1 | 6/2012 |
| DE | 102012200531 A1 | 7/2012 |
| DE | 102014218792 A1 | 3/2016 |

OTHER PUBLICATIONS

Toshiba, "Ocsillation Frequency Detector (OFD)", TMPM367FDFG, Oct. 11, 2013, 1 page.

*Primary Examiner* — Matthew V Nguyen
(74) *Attorney, Agent, or Firm* — Slater Matsil, LLP

(57) ABSTRACT

In accordance with an embodiment, a circuit includes a power conversion circuit including an inductor and configured to convert an input voltage to an output voltage in accordance with at least one switching signal. The circuit further includes a first current sense circuit configured to generate a current sense signal that represents an inductor current, a voltage sense circuit configured to generate a voltage sense signal that represents the output voltage, and a switching controller including an error amplifier configured to generate an error signal representing the difference between a reference voltage and the voltage sense signal. The switching controller further includes an oscillator circuit configured to generate, for pulse frequency modulation (PFM) operation of the power conversion circuit, the switching signal as a sequence of pulses with a pulse repetition frequency that depends on the error signal and the current sense signal.

19 Claims, 5 Drawing Sheets

(51) Int. Cl.
*H03K 7/06* (2006.01)
*H02M 1/00* (2006.01)

(58) Field of Classification Search
CPC .. H02M 2001/0009; H02M 2001/0032; H03K 7/06; H03K 7/08
See application file for complete search history.

(56) References Cited

U.S. PATENT DOCUMENTS

| | | | |
|---|---|---|---|
| 8,319,487 B2* | 11/2012 | Michishita | H02M 3/156 323/223 |
| 2011/0241641 A1* | 10/2011 | Chen | H02M 3/1588 323/284 |
| 2013/0293211 A1* | 11/2013 | Chen | H02M 3/1588 323/282 |
| 2018/0131275 A1* | 5/2018 | Guan | H02M 3/156 |
| 2019/0081546 A1* | 3/2019 | Hsu | H02M 1/08 |

* cited by examiner

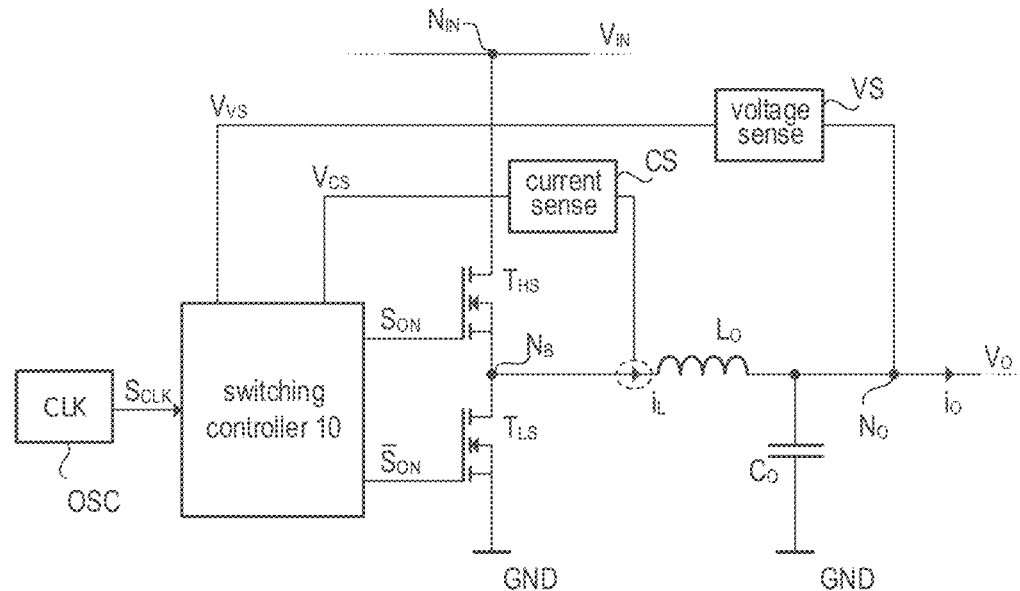
Fig. 1
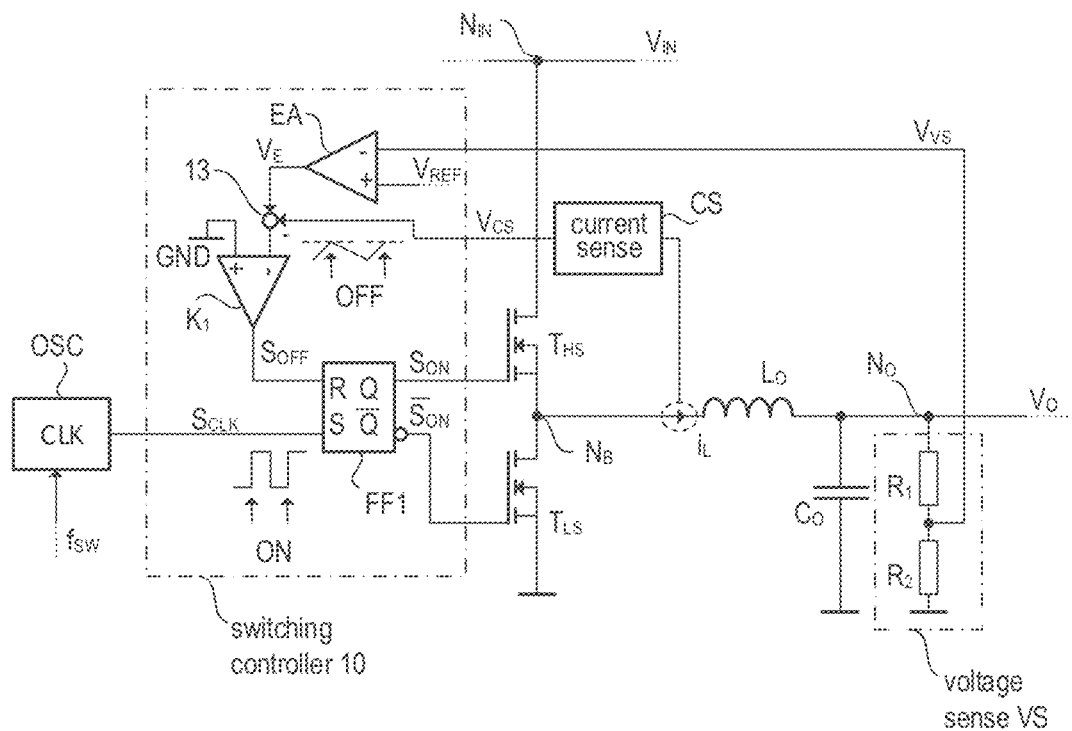
Fig. 2   current mode control in PWM

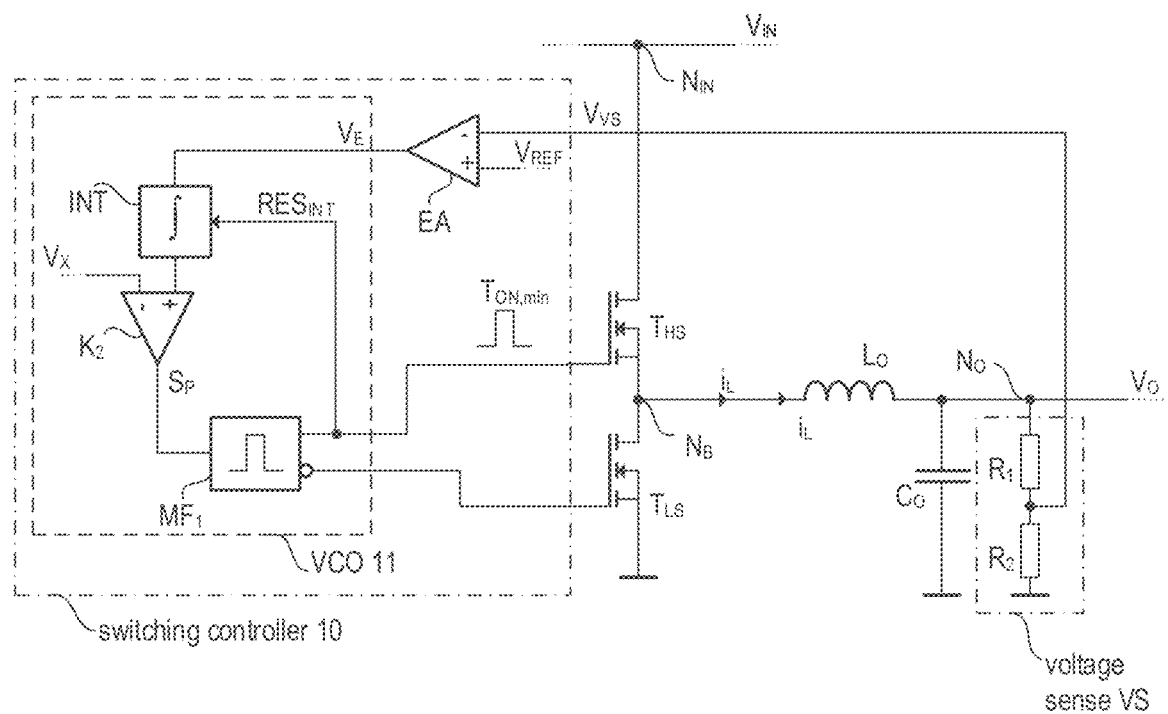
Fig. 3   voltage mode control in PFM
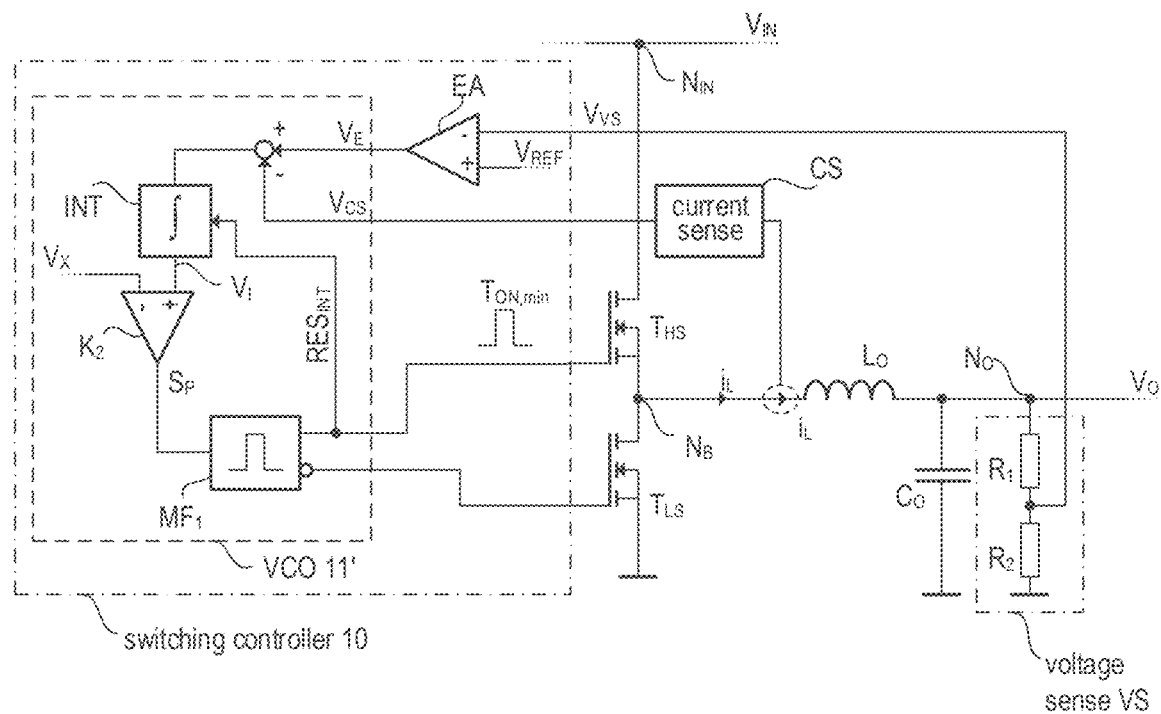
Fig. 4   current mode control in PFM

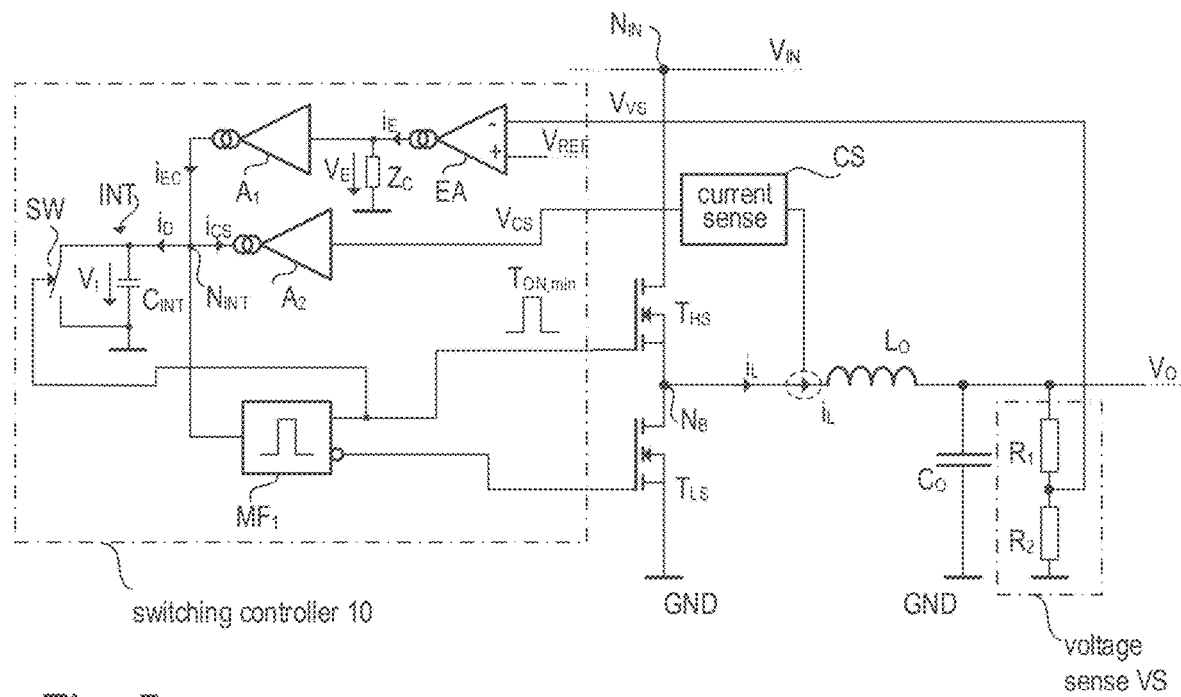
Fig. 5    current mode control in PFM
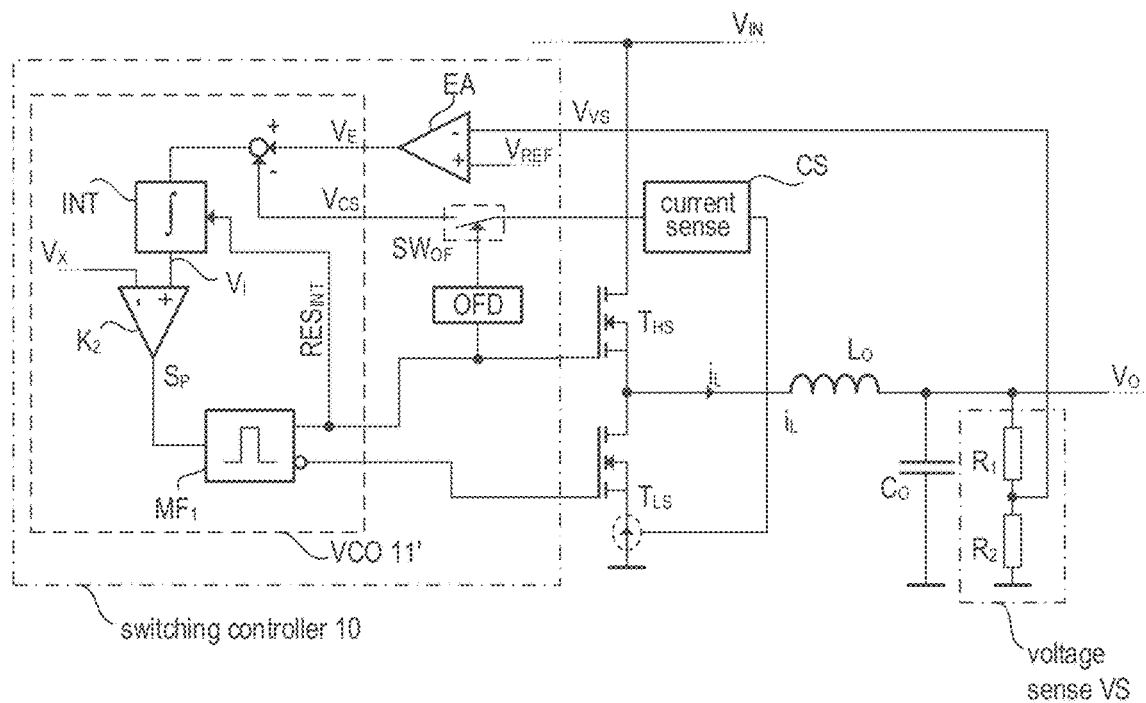
Fig. 6    current mode control in PFM

SWITCHING CONVERTER USING PULSE-FREQUENCY MODULATION AND CURRENT-MODE CONTROL

This application claims the benefit of German Application No. 102018101932.7, filed on Jan. 29, 2018, which application is hereby incorporated herein by reference in its entirety.

TECHNICAL FIELD

The present disclosure relates to the field of switching converters.

BACKGROUND

Switching converters are usually operated in different operating modes dependent on one or more parameters such as the input voltage, the output voltage and the output current (i.e. the load). The different operating modes differ in the switching control of the electronic switches that control the current flow through an inductor (choke) of the switching converter. Switching converters can be operated in continuous conduction mode (CCM) and discontinuous conduction mode (DCM). In CCM the inductor current continuously passes through the inductor without dropping to zero, whereas in DCM, the inductor current has a discontinuous waveform as the current drops to zero in each switching cycle.

The switching operation of electronic switches is determined by a switching signal that triggers activation/deactivation of the electronic switches. The switching signal is a logic signal (i.e. assumes only a logic high level or a logic low level) than can be modulated using different modulation schemes in order to regulate, e.g., the output voltage or the output current. Common modulation schemes are pulse width modulation (PWM) and pulse frequency modulation (PFM). When using PWM, the duty cycle of the switching signal is adjusted by adjusting the on-time (i.e. the pulse width) of the switching signal in each switching cycle, while the switching frequency is constant. When using PFM, the switching frequency is adjusted by adjusting the temporal position of the pulses of the switching signal, while the pulse-width (i.e. the on-time in a switching cycle) is constant.

Both modes, CCM and DCM, can be combined with one of the modulation schemes PWM and PFM. In this example four operating modes can be distinguished, i.e. PFM-DCM, PWM-DCM, PWM-CCM, and PFM-CCM. The achievable efficiency of the power conversion can be different for different operating modes for a specific operating point (e.g., for a specific combination of input voltage, output voltage, output current). Further, some operation modes may not be suitable for a specific range of operating modes. In order to optimize efficiency, multimode switching converters have been developed, which are configured to operate in two or more different operating modes. The operating point of the switching converter is monitored and, if a mode switch condition is reached, the operating mode is changed.

In some operating modes stability problems may occur, whereas a stable operation is usually ensured when using PWM-CCM. However, particularly PFM-CCM may cause undesired behavior of the switching controller in a specific range of operating points such as operating points with high input voltage (as compared to the output voltage) and high output current (high load).

SUMMARY

A circuit is described herein. In according with one embodiment the circuit includes a power conversion circuit including an inductor and is configured to convert an input voltage to an output voltage in accordance with at least one switching signal. The circuit further includes a first current sense circuit configured to generate a current sense signal that represents an inductor current, a voltage sense circuit configured to generate a voltage sense signal that represents the output voltage, and a switching controller including an error amplifier configured to generate an error signal representing the difference between a reference voltage and the voltage sense signal. The switching controller further includes an oscillator circuit configured to generate, for pulse frequency modulation (PFM) operation of the power conversion circuit, the switching signal as a sequence of pulses with a pulse repetition frequency that depends on the error signal and the current sense signal.

Moreover, a method is described herein. In accordance with one embodiment the method includes sensing an output voltage at a power conversion circuit and providing a respective voltage sense signal, sensing a current indicative of an inductor current passing through an inductor of the power conversion circuit and providing a respective current sense signal, and determining an error signal based on the voltage sense signal and a reference voltage. The method further includes generating at least one pulse-frequency modulated switching signal using an oscillator that generates, for pulse frequency modulation (PFM) operation of the power conversion circuit, the switching signal as a sequence of pulses with a pulse repetition frequency that depends on the error signal and the current sense signal.

BRIEF DESCRIPTION OF THE DRAWINGS

The invention can be better understood with reference to the following drawings and descriptions. The components in the figures are not necessarily to scale; instead emphasis is placed upon illustrating the principles of the invention. In the figures, like reference numerals designate corresponding parts. In the drawings:

FIG. 1 is a circuit diagram illustrating one general example of a buck-converter regulating both output voltage and inductor current (current-mode control);

FIG. 2 is a circuit diagram illustrating one example of a switching controller for PWM operation;

FIG. 3 is a circuit diagram illustrating one example of a switching controller for PFM operation;

FIG. 4 is a circuit diagram illustrating one embodiment of a switching controller for PFM operation with current feedback;

FIG. 5 illustrates one exemplary implementation of the generic example of FIG. 4 using transconductance amplifiers;

FIG. 6 illustrates one modification of the example of FIG. 4, according to which the current feedback can be deactivated for low switching frequencies;

DETAILED DESCRIPTION OF ILLUSTRATIVE EMBODIMENTS

Figure 7:
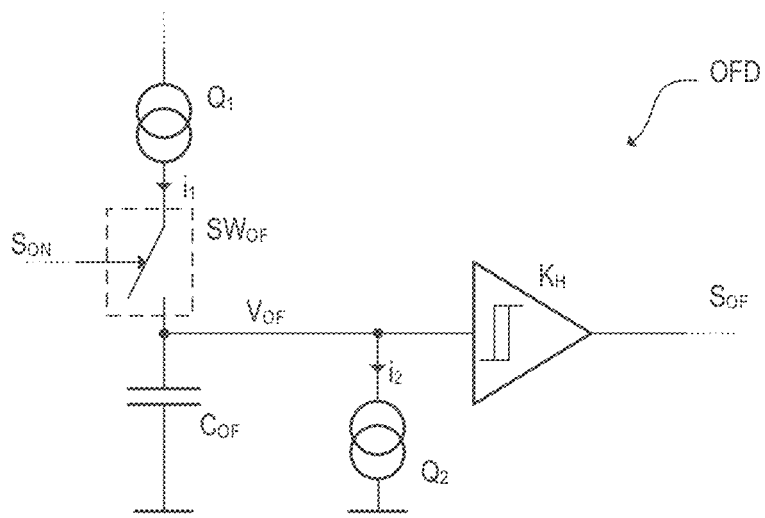
FIG. 7 illustrates one exemplary embodiment of an overfrequency detector which may be used to activate the current feedback for higher frequencies in the example of FIG. 6.

FIG. 1 is a circuit diagram illustrating one general example of a buck-converter. It is understood, however, that the concepts described herein may be readily applied to other switching converter topologies such as flyback-converter, buck-boost converter boost converter topologies, etc.

In the present example, the buck converter includes a switching circuit, which is connected between an input circuit node $N_{IN}$ and a reference node GND. An input voltage $V_{IN}$ is applied between the input circuit node $V_{IN}$ and the reference node GND, which is usually at a reference potential $V_{GND}$ (e.g. ground potential). In the present example, the switching circuit is implemented as a transistor half bridge that is composed of a high-side transistor $T_{HS}$ and a low-side transistor $T_{LS}$. The two transistors $T_{LS}$ and $T_{HS}$ are connected in series at an output circuit node $N_B$ of the switching circuit. In the present examples, the two transistors $T_{LS}$ and $T_{HS}$ are implemented as MOS transistors (MOSFETs). However, any other type of transistor may be employed instead. In some examples, a diode may be used instead of the low-side transistor $T_{LS}$.

The switching converter further includes an inductor $L_O$, which is connected between the output circuit node $N_B$ of the switch circuit (e.g. the transistor half-bridge) and an output circuit node $N_O$ (shortly referred to as output) of the switching converter, at which the output voltage $V_{OUT}$ is provided. According to the present example, an output capacitor $C_O$ is connected between the output $N_O$ of the switching converter and the reference circuit node GND (e.g. ground node) in order to buffer the output voltage $V_O$. Generally, the switching circuit is configured to alternatingly apply the input voltage $V_{IN}$ and the reference voltage $V_{GND}$ to the LC-circuit composed of inductor $L_o$ and capacitor $C_O$.

The switching operation of the switching circuit may be determined by one or more switching signals, which are generated by the switching controller 10. In the present example of FIG. 1 the switching signal, which is supplied to the high-side transistor $T_{HS}$, is denoted as $S_{ON}$, whereas the switching signal, which is supplied to the low-side transistor, is denoted as $\overline{S}_{ON}$. It is noted that the signal $\overline{S}_{ON}$ is basically an inverse version of the signal $S_{ON}$ (except for a small dead time). In other implementations, a single switching signal $S_{ON}$ may be sufficient, for example, because the switching circuit includes only one active electronic switch or circuitry for distributing the switching signal $S_{ON}$ to two or more electronic switches. It is noted that, in some specific operating modes (e.g. DCM burst mode), both transistors of the half-bridge may be temporarily switched-off at the same time to avoid a discharge of the output capacitor $C_O$.

Pulse-width modulation (PWM) is as such known in the field of switching converters and thus the generation of the switching signal is only shortly summarized here. Generally, the switching signal $S_{ON}$ has a constant frequency denoted as $f_{SW}$, while the on-time $T_{ON}$ of the switching signal $S_{ON}$ is adjusted in each switching cycle. The ratio between the on-time $T_{ON}$ and the switching period $T_{SW} = f_{SW}^{-1}$ is usually referred to as duty cycle. In other words, the duty cycle of the switching signal is updated in each switching cycle in order to regulate the output voltage or the output current, while the switching period $T_{SW}$ is substantially constant. The switching frequency $f_{SW}$ may be determined by a clock signal $S_{CLK}$ that may be generated by an oscillator OSC. Oscillator OSC may be implemented using any known oscillator circuit such as a relaxation oscillator circuit or the like.

Another modulation technique commonly used in switching converters is pulse-frequency modulation (PFM). When PFM is used, the on-time $T_{ON}$ of the switching signal $S_{ON}$ is substantially constant and the switching frequency $f_{SW}$ is adjusted by the switching controller such that the output voltage $V_O$ is maintained at or close to a desired set-point value.

To regulate the output voltage, the switching controller needs some information about the output voltage $V_O$. Thus, the circuit may include a voltage sense circuit VS that is configured to directly or indirectly sense the output voltage $V_O$ and provide a respective voltage sense signal $V_{VS}$ indicative of the actual output voltage $V_O$ (voltage feedback). According to one specific example, the voltage sense circuit may be implemented as a simple voltage divider. However, more complex voltage sense circuits may be used in other examples. In some operating modes the switching controller 10 may implement a so-called current-mode control, for which a current feedback is used. Accordingly, the switching controller may include a current sense circuit CS, which is configured to directly or indirectly sense the inductor current $i_L$ and provide a respective current sense signal $V_{CS}$ indicative of the actual inductor current $i_L$. In one simple example, the current sense circuit may include a current sense resistor. In other examples, more complex current sense circuits such as so-called Sense-FET arrangements may be used to sense the current.

FIG. 2 illustrates one exemplary implementation of the switching controller 10, wherein only those components are shown which are used for current-mode control during PWM operation and relevant to the following explanations. As shown in FIG. 2, current-mode control makes use of two feedback loops, i.e. current feedback as well as a voltage feedback. Basically, a first (inner) control loop regulates the inductor current $i_L$. The (peak) current set-point (see FIG. 1, error signal $V_E$) for the current control is determined by a second (outer) control loop and set such that the output voltage $V_O$ is stabilized at a desired voltage set-point.

In the example of FIG. 2, the switching controller 10 includes an RS flip-flop $FF_1$, which receives the clock signal $S_{CLK}$ at a set input S. Accordingly, the switching signal $S_{ON}$ provided at output Q of the RS flip-flop $FF_1$ is set to a high signal level regularly and synchronously to the clock signal $S_{CLK}$. The RS flip-flop $FF_1$ receives a reset signal $S_{OFF}$ at a reset input R, wherein the reset signal $S_{OFF}$ indicates (by applying a high level at the reset input R) the time instant at which the inductor current $i_L$ reaches a current set-point. The inductor current $i_L$ is represented by current sense signal $V_{CS}$ and the current set-point by the current level or the error signal $V_E$. The switching controller 10 includes a comparator $K_1$ that is configured to compare the current sense signal $V_{CS}$ with the error signal $V_E$. In the present example, this comparison is implemented such that the comparator $K_1$ actually compares the difference $V_E - V_{CS}$ with the reference potential (e.g. 0 volts). Each time the current sense signal $V_{CS}$ reaches the current level of the error signal $V_E$ (and thus the e difference $V_E - V_{CS}$ becomes zero), the comparator $K_1$ signals to the RS flip-flop $FF_1$ to reset the switching signal $S_{ON}$ to a low signal level. The inverse switching signal $\overline{S}_{ON}$ is provided at output $\overline{Q}$. In the present example, the difference $V_E - V_{CS}$ is obtained from the subtraction block 13. The RS flip-flop $FF_1$ in combination with the comparator $K_1$ basically operates as duty cycle control circuit; the RS flip-flop is set in each switching cycle while the reset (and thus the duty cycle) is triggered by the comparator $K_1$. It is understood that many different ways of implementing the function of the generic circuit of FIG. 2 are as such known.

The mentioned error signal $V_E$ (i.e. the current set-point for the inner control loop) is provided at an output of error amplifier EA, which is configured to amplify the control error $V_{VS}$-$V_{REF}$, wherein $V_{VS}$ is a voltage sense signal representing the output voltage $V_{OUT}$ and $V_{REF}$ is a reference voltage representing the voltage set-point for the outer control loop. Optionally, an integrator and/or a loop filter may be coupled between the error amplifier EA and the comparator $K_1$.

To summarize the above, in PWM-CCM the switching controller 10 makes use of two feedback loops, wherein the first feedback loop is formed by the current sense circuit CS and comparator $K_1$ and the second feedback loop is formed by the voltage sense circuit VS and the error amplifier EA. The first feedback loop is part of a control loop used for controlling the inductor current $i_L$, whereas the second feedback loop is part of a control loop used for controlling the output voltage $V_O$.

As mentioned above, PWM-CCM may not be suitable in some situations. For example, when the switching converter is loaded with only a very light load (output current low) or when the ratio $V_{IN}/V_O$ is high, a mode switch to PFM-DCM or PFM-CCM (or other modes such as Bust Mode) may be necessary in order to be able to maintain the output voltage regulation. As multi-mode switching controllers are as such known, mode switch conditions are not discussed in detail herein.

One example of a switching controller operating in PFM-CCM mode is illustrated in FIG. 3, wherein, to keep the illustration simple, only those components are shown which are relevant to the following explanations. Accordingly, only those portions of the switching controller 10 are shown which are used for PFM control. It is understood that both the circuit components used for PWM control and the circuit components used for PFM operation, as well as further circuitry for triggering mode switches or the like, can be included in the switching controller 10.

According to the FIG. 3 the switching circuit (transistor half-bridge), the inductor $L_O$, the output capacitor $C_O$, the voltage sense circuit VS; and the error amplifier EA are the same as in the example of FIG. 2. However, the configuration of the switching controller is different from the previous example. Accordingly, the output signal $V_E$ of the error amplifier EA (error signal) is integrated by (inverting) integrator INT, and the integrated error signal is compared to a threshold $V_X$ (which may be 0 volts in the present example) by comparator $K_2$. The output of the comparator $K_2$ is coupled to a mono-flop MF1 that is configured to generate a pulse of defined (and constant) pulse length $T_{ON,min}$.

A pulse is generated in response to the comparator $K_2$ detecting that the integrated error signal has reached the threshold $V_X$ provided to the comparator $K_2$. As such, the pulse length (on-time $T_{ON,min}$) of the pulses in the switching signal is fixed, wherein the switching frequency $f_{SW}$ (pulse repetition frequency) varies in accordance with the measured error signal $V_E$. As in the previous example of FIG. 1, the switching signal $S_{ON}$ is supplied to the high side transistor $T_{HS}$ and an inverse switching signal $\overline{S}_{ON}$ to the low-side transistor $T_{LS}$ of the half-bridge. It is noted that the integrator INT and the comparator $K_2$ in combination with the mono-flop MF1, which provides the reset signal $RES_{INT}$ for the integrator INT, can be seen as a kind of voltage controlled oscillator (VCO), denoted as VCO 11 in FIG. 3.

The higher the input voltage $V_E$, the steeper is the slope of the integrator output voltage $V_1$ and thus the higher the pulse repetition frequency (switching frequency $f_{SW}$) of the pulses at the output of the monoflop MF1 (signal $S_{ON}$). In each switching cycle, the integration time restarts at the end of the on-time $T_{ON,min}$.

As can be seen in FIG. 3, only one feedback loop is used during conventional PFM operation; the current sense circuit CS is not in use in PFM operating modes. The control structure shown in FIG. 3 basically generates one pulse of the switching signal $\overline{S}_{ON}$ each time the integrated error signal $V_E$ reaches a specific threshold value $V_X$. However, in some operation points (e.g. when experiencing output current steps) the control concept used in the example of FIG. 3 may lead to instabilities; those instabilities may cause increased noise/oscillations in the output signal $V_O$, which is undesired in some applications.

FIG. 4 is a switching converter with a switching controller 10 that is similar to the switching controller of the previous example if FIG. 3. Again, only those circuit components that are used in PFM operation and relevant to the following explanations are shown. In essence, the circuit of FIG. 4 is identical with the circuit of FIG. 3 with one significant enhancement which enables a kind of current mode control during PFM operation. As compared to the previous example of FIG. 4, the switching controller 10 uses an additional current feedback loop including the current sense circuit CS (see FIG. 1), wherein the current sense signal $V_{CS}$ is combined with (e.g. subtracted from) the error signal $V_E$, which is provided at the output of the error amplifier EA. Accordingly, the (inverting) integrator INT receives the difference signal $V_E$-$V_{CS}$ and integrates it (and changes the sign); the resulting integrated signal $V_I$ is provided at the output of the integrator INT and supplied to the comparator $K_2$ as in the previous example. Except for this additional feedback loop, the circuit of FIG. 4 is the same as in FIG. 3 and reference is made to the respective explanations above. The integrator INT and the comparator $K_2$ in combination with the mono-flop $MF_1$, which provides the reset signal $RES_{INT}$ for the integrator INT, can be seen as a kind of voltage controlled oscillator (VCO), denoted as VCO 11' in FIG. 4. The higher the input voltage $V_E$, the steeper is the slope of the integrator output voltage $V_1$ and thus the higher the pulse repetition frequency (switching frequency $f_{SW}$) of the pulses at the output of the monoflop MF1 (signal $S_{ON}$). Different from the previous example of FIG. 3, the VCO 11' is not purely voltage controlled, but receives a current feedback as well, which improves stability of the closed control loop and avoids oscillations/ringing at the output node.

FIG. 5 illustrates one exemplary implementation of the generic example of FIG. 4. Accordingly, the error amplifier EA is implemented as a transconductance amplifier that has a resistor (or generally an impedance) $Z_C$ coupled to its output; the output current $i_g$ of the error amplifier EA is proportional to the difference $V_{REF}$-$V_{VS}$ and is thus indicative of the control error concerning the output voltage $V_O$. The current $i_g$ passes through the impedance $Z_C$ and causes a voltage drop $V_E$ (error signal). Impedance $Z_C$ may include a capacitor for drift compensation.

The integration of the difference $V_E$-$V_{CS}$ (cf. FIG. 4) is implemented by the transconductance amplifiers $A_1$ and $A_2$ and capacitor $C_{INT}$. Accordingly, the transconductance amplifier $A_1$ converts the error signal $V_E$ into a current $i_{EC}$ and the transconductance amplifier $A_2$ converts the current sense signal $V_{CS}$ into a (negative) current $i_{CS}$ (i.e. the transconductance amplifier $A_2$ operates as a current sink)

The outputs of the transconductance amplifiers $A_1$ and $A_2$ are connected to a capacitor $C_{INT}$ at circuit node $N_{INT}$, so that the currents $i_E$ and $i_{CS}$ superpose and the difference current $i_E - i_{CS}$ passes through the capacitor $C_{INT}$. Accordingly, the voltage drop $V_I$ across the capacitor is $$V_I = C_{INT} \int_0^t i_E - i_{CS} d\tau = C_{INT} \int_0^t g_1 V_E - g_2 V_{CS} d\tau.$$

wherein $g_1$ and $g_2$ denote the transconductance of transconductance amplifiers $A_1$ and $A_2$, respectively. A switch SW is connected in parallel to the capacitor $C_{INT}$ and configured to discharge it in response to a pulse generated by the monoflop MF1. Accordingly, in each cycle, the switch opens at the end of an on-time $T_{ON,min}$ and the difference current $i_E - i_{CS}$ is integrated during the (variable) off time $T_{OFF}$ (integration time $t=0 \ldots T_{OFF}$). As soon as the voltage drop $V_I$ across the capacitor $C_{INT}$ reaches the trigger threshold of the mono-flop MF1, another pulse is generated by the monoflop MF1 and the off time $T_{OFF}$ ends. The total switching period $T_{SW}$ is thus $T_{ON,min} + T_{OFF}$, wherein the on-time $T_{ON,min}$ is constant and the off-time $T_{OFF}$ depends on the level of the feedback signals (current sense signal $V_{CS}$ and voltage sense signal $V_{VS}$). Apart from the specific implementation of the switching controller 10, the circuit of FIG. 5 is the same as in the previous examples and reference is made to the respective explanations above.

FIG. 6 illustrates a modification/enhancement of the example shown in FIG. 4. As compared with the example of FIG. 4, the present example includes an over-frequency detection circuit OFD which receives the switching signal $S_{ON}$ (or the inverse signal $\overline{S}_{ON}$) and which is configured to detect whether the switching frequency $f_{SW}$ of the switching signal $S_{ON}$ has fallen below a frequency threshold $f_{TH}$. If the switching frequency $f_{SW}$ is below the frequency threshold $f_{TH}$ ($f_{SW} < f_{TH}$) then the over-frequency detection circuit OFD disconnects the current feedback loop e.g. using switch $SW_{OF}$. Accordingly, the switch $SW_{OF}$ may be arranged between the current sense circuit CS and the subtractor circuit that provides the difference $V_E - V_{CS}$ and be configured to connect and disconnect the current sense circuit CS from the subtraction circuit in accordance with an over-frequency signal provided by the over-frequency detection circuit OFD. Alternatively, the current sense circuit CS may be deactivated, which may be achieved in various ways dependent on the implementation of the current sense circuit CS.

Furthermore, in the present example, the current sense circuit CS senses the current through the low-side transistor $T_{LS}$, whereas in the previous example, the current passing $i_L$ through the inductor $L_O$ is used instead. However, as the current information is only needed during the off-time—i.e. when the high-side transistor $T_{HS}$ is off and the low-side transistor $T_{LS}$ is on—it does not matter that no current information is available during the (constant) on-time $T_{ON,min}$.

As mentioned, the current feedback may help to improve stability and avoid oscillations/ringing at the output node $N_O$. However, instabilities mainly arise at higher output currents when the switching converter operates in PFM-CCM. Thus, the current feedback is not needed at lower output currents when the switching converter operates in PFM-DCM. Disconnecting/Deactivating the current sense circuit CS allows a reduction of quiescent current consumption in operating states with low load (and thus low output currents) and thus an improvement of efficiency during operation with low loads.

FIG. 7 illustrates one exemplary implementation of the over-frequency detection circuit OFD. It is understood that the function provided by the over-frequency detection circuit OFD may be implemented in various other ways. In the depicted example, the over-frequency detection circuit OFD includes a capacitor $C_{OF}$, wherein the voltage across the capacitor is denoted $V_{OF}$. The capacitor is coupled between an input of a comparator $K_H$, which may have a hysteresis, and a reference potential, e.g. ground potential. The capacitor $C_{OF}$ is coupled to a current source $Q_1$ via an electronic switch $SW_{OF}$, which is activated and deactivated in accordance with the switching signal $S_{ON}$ (see FIG. 6). Further, the capacitor $C_{OF}$ is connected to a current sink $Q_2$, which sinks a constant current $i_2$ throughout a switching period $T_{SW} = 1/f_{SW}$ while the current source $Q_1$ sources a current $i_1$ during the on-time $T_{ON}$ only. The capacitor charge is in steady state for $f_{SW} = f_{TH}$ when the net charge applied to the capacitor is zero, that is $$i_1 T_{ON} = \frac{i_2}{f_{TH}}.$$

Consequently, the capacitor voltage $V_{OF}$ will rise (until saturation of the current source) as soon as the switching frequency exceeds the frequency threshold $f_{TH}$:

$$f_{SW} > \frac{i_2}{i_1 T_{ON}}.$$

when the above condition is true, the capacitor voltage $V_{OF}$ will quickly reach the trigger threshold of the comparator $K_H$ and the comparator output signal $S_{OF}$ may indicate a (re-) activation of the current sense circuit CS (see FIG. 6).

Figure 8:
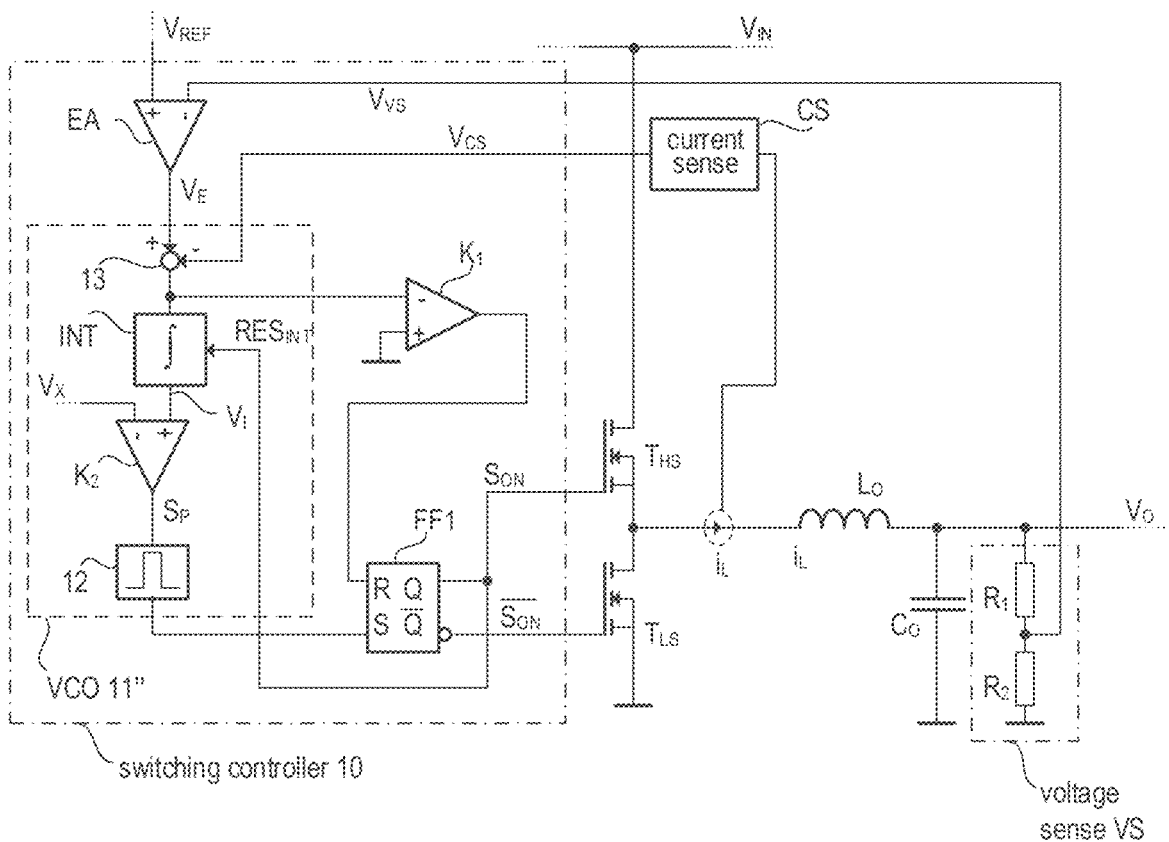
FIG. 8 illustrates one exemplary embodiment of a multimode switching converter, wherein the switching controller combines the functions of the examples of FIGS. 2 and 4.

The examples of FIGS. 4 to 6 relate to a switching converter operating with PFM (e.g. PFM-DCM or PFM-CCM) and current feedback to the voltage controlled oscillator (see VCO 11 and FIGS. 4-6), whereas the example of FIG. 2 relates to conventional PWM operation. These two concepts can be combined; the resulting switching converter is a multi-mode converter that automatically changes from PFM operation to PWM operation and vice versa. FIG. 8 illustrates one exemplary implementation of such a multi-mode switching controller and is basically a combination of the examples of FIGS. 2 and 4, wherein the voltage controller oscillator (VCO) 11" takes over the function of oscillator OSC (see FIG. 2) during PWM operation. During PFM operation (at light load) the VCO 11' provides a variable frequency $f_{SW}$, which increases as the error signal $V_E$ increases (for a given current $i_L$). The VCO 11" is essentially the same as in the previous example of FIG. 4. However, the output comparator $K_2$ is connected with a timing circuit 12 (instead of the mono-flop MF1 used in the previous examples) which ensures that the output signal $S_p$ satisfies a specific minimum on-time $T_{ON,min}$ as well as a specific minimum off-time $T_{OFF,min}$. Thus, the timing circuit 12 can be regarded as a kind of one-shot mono-flop, which—when triggered—generates a pulse at its output with a pulse length $T_{ON,min}$ (on-time), wherein a re-triggering is not possible before the minimum off-time $T_{OFF,min}$ has elapsed after the pulse. Accordingly, the minimum switching period is $T_{ON,min} + T_{OFF,min}$, and the corresponding maximum switching frequency $f_{SW,max}$ is $1/T_{SW,min}$. Accordingly, the switching frequency of the VCO 11" is limited to a maximum switching frequency $f_{SW,max}$.

When, in PFM operation, the switching frequency $f_{SW}$ reaches the maximum switching frequency $f_{SW,max}$ (e.g., because the required output power increases), PFM operation stops "automatically" and output voltage regulation is continued using PWM, and the duty cycle is varied using the comparator $K_1$ as in the example of FIG. 2. Thereby the parameters $f_{SW,max}$ and $T_{ON,min}$, are chosen such that a smooth transition between PFM and PWM (and vice versa) is guaranteed.

In the circuit of FIG. 8, the RS flip-flop $FF_1$ is practically neutral (transparent), when operating in PFM. The timing circuit 12 (one-shot mono-flop) ensures that the RS flip-flop $FF_1$ maintains a set state for the minimum on-time $T_{ON,min}$ and the comparator $K_1$ causes an immediate reset of the RS flip-flop $FF_1$ after the minimum on-time $T_{ON,min}$. In PWM operation (at maximum switching frequency $f_{SW,max}$), the RF flip-flop $FF_1$ has substantially the same function as in the example of FIG. 2, i.e. it operates in connection with the comparator $K_1$ as a duty cycle control circuit. That is, the RF flip-flop $FF_1$ is regularly set in each switching cycle and reset when the current feedback signal $V_{CS}$ reaches the level of the error signal $V_E$, as in the example of FIG. 2 thus adjusting the duty cycle of the switching signal $S_{ON}$ while the switching frequency $f_{SW}$ is at its maximum $f_{SW,max}$.

When, in PWM operation (while $f_{SW}=f_{SW,max}$), the duty cycle becomes so small that the on time $T_{ON}$ reaches the minimum on time $T_{ON,min}$ (e.g. because the required output power decreases), then the level of the output signal $V_O$ will (slightly) increase because the duty cycle can no longer be reduced. This leads to a lower level of the error signal $V_E$ (or even $V_E$ becoming negative), which causes the VCO 11" to reduce the switching frequency $f_{SW}$ below the maximum frequency $f_{SW,max}$, while the minimum on-time $T_{ON,min}$ is maintained. PWM operation stops "automatically" and the further operation is continued in PFM. As mentioned, during PFM operation, the RS flip-flop FF1 has practically no effect (i.e. is neutral/transparent); the VCO 11" keeps the RS flip-flop set for at least the minimum on time $T_{ON}$ while the comparator $K_1$ resets the RS flip-flop practically immediately after the minimum on time $T_{ON}$.

Figure 9:
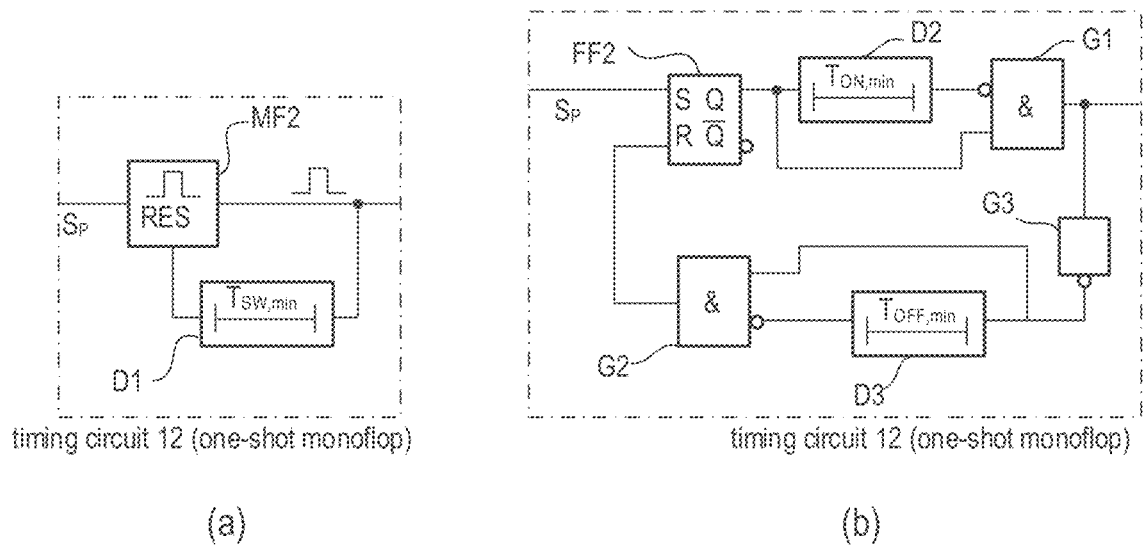
FIG. 9 includes two examples of a one-shot monostable multivibrator used in the example of FIG. 8.

Diagrams (a) and (b) of FIG. 9 illustrate two examples of the timing circuit 12. According to the example of diagram (a) of FIG. 9, the timing circuit 12 includes a one-shot mono-flop MF2 with a reset input RES. Once triggered by signal $S_p$ (see FIG. 8), the one-shot mono-flop MF2 cannot be re-triggered until it is reset. The reset signal is a delayed version of the output signal of the mono-flop MF2, wherein a delay $T_{SW,min}$ is accomplished by delay circuit D1 that is coupled between the mono-flop's output and its reset input RES. Accordingly, the reset takes place a time $T_{SW,min}$ after triggering the mono-flop MF2. Reference is made to the above description of FIGS. 2 and 4 with regard to the circuit components not discussed in connection with FIG. 9.

According to the example of diagram (b) of FIG. 9, the timing circuit 12 includes an RS flip flop FF2, which is set by the signal $S_p$ (see FIG. 8). The output of the RS flip flop FF2 is blanked after the on-time $T_{ON,min}$ thus generating a pulse with a pulse length of $T_{ON,min}$ at the output of the timing circuit 12. The pulse may be generated using any conventional circuitry such as the delay element D2 (delay $T_{ON,min}$) and the AND gate G1, wherein a non-inverting input of the AND gate G1 is connected to the output of the RS flip-flop FF2 and an inverting input of the AND gate G1 is coupled to the output of the RS flip-flop FF2 via delay element D2. The output signal of the timing circuit 12 is provided at the output of the AND gate G1. Any retriggering of the timing circuit 12 has no effect before the RS flip flop FF2 has been reset. The reset is accomplished by the inverter G3, the AND gate G2 and the delay circuit D3 (delay $T_{OFF,min}$). The output of AND gate G1 is inverted by inverter G3 and delayed by delay circuit D3. The inverted signal is provided to the non-inverting input of AND gate G2 and the delayed inverted signal is provided to the inverting input of AND gate G2. Thus, the AND gate G2 generates a reset pulse, which is delayed by $T_{OFF,min}$ relative to the output pulse generated by AND gate G1.

It is understood that numerous other options exist for implementing the function provided by the exemplary circuits shown in FIG. 9. The actual implementation may depend on the semiconductor technology used.

Figure 10:
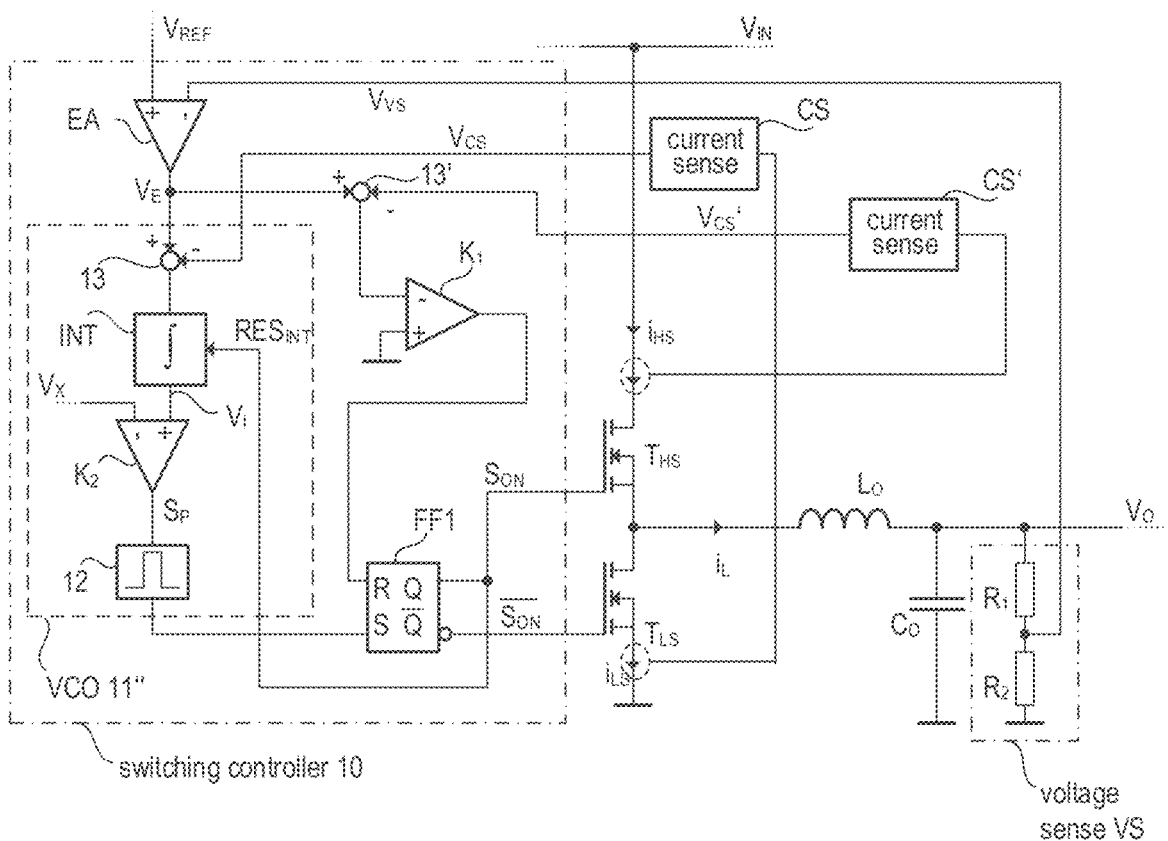
FIG. 10 is a modification of the example of FIG. 8, wherein the transistor currents passing through the transistor bridge are measured instead of the inductor current.

FIG. 10 illustrates a further example of a multi-mode switching converter with an improved regulation when operating in PFM. The circuit of FIG. 10 is substantially the same as the previous example of FIG. 8 except for the implementation of the current sensing. While in the previous examples the inductor current $i_L$ is measured at the output of the half bridge, the present example senses the transistor currents $i_{HS}$ and $i_{LS}$ passing through the high-side transistor $T_{HS}$ and, respectively, the low-side transistor $T_{HS}$ of the half-bridge. This allows, for example, the use of common sense-FET circuits for current sensing. As can be seen from FIG. 10, the inductor current $i_L$ equals the current $i_{HS}$ passing through the high-side transistor $T_{HS}$ during the on-time, which is measured by current sense circuit CS' (current sense signal $V_{CS}'$). Similarly, the inductor current $i_L$ equals the current $i_{LS}$ passing through the low-side transistor $T_{LS}$ during the off-time, which is measured by current sense circuit CS (current sense signal $V_{CS}$).

As the integrator INT of the VCO 11" is only active during the off-time, the current sense signal $V_{CS}$, which represents the current $i_{LS}$, is used as current feedback signal in the VCO 11" and the current sense signal $V_{CS}$ is supplied to the subtractor circuit 13 as in the previous examples. In PWM, the duty cycle regulation (comparator $K_1$) is only active during the on-time, and thus the current sense signal $V_{CS}'$ is supplied to subtractor circuit 13' which provides the difference $V_E - V_{CS}'$ supplied to comparator $K_1$. Particularly when using separate current sense circuits for sensing the current through the high-side transistor $T_{HS}$ and the low-side transistor $T_{LS}$ it may be advantageous during PFM operation to deactivate the current sense circuit CS when the switching frequency $f_{SW}$ falls below the threshold frequency $f_{TH}$ ($f_{SW} < f_{TH}$). Furthermore, the current sense circuit CS' is not needed during PFM operation and can be deactivated. As such, the over-frequency detector circuit OFD of the example of FIG. 6 may also be used in the present example of FIG. o10 in order to reduce quiescent current consumption at very light load, as in such an operating state the current feedback $V_{CS}$ is not needed to improve stability. As such, efficiency may be improved by selectively deactivating the current sense circuits CS (when operating in PFM and $f_{SW} < f_{TH}$) and the current sense circuit CS' (while operating in PFM).

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

What is claimed is:

1. A circuit comprising:
   a power conversion circuit including an inductor and configured to convert an input voltage to an output voltage in accordance with a switching signal;
   a first current sense circuit configured to generate a current sense signal that represents an inductor current;
   a voltage sense circuit configured to generate a voltage sense signal that represents the output voltage;
   a switching controller including an error amplifier configured to generate an error signal representing a difference between a reference voltage and the voltage sense signal; and
   an oscillator circuit configured to generate, for pulse frequency modulation operation of the power conversion circuit, the switching signal as a sequence of pulses with a pulse repetition frequency that depends on the error signal and the current sense signal, wherein the oscillator circuit includes an integrator coupled with the error amplifier and the first current sense circuit.

2. The circuit of claim 1, wherein the switching controller further comprises:
   an over-frequency detector circuit coupled to the oscillator circuit and configured to detect when the pulse repetition frequency reaches or exceeds a frequency threshold,
   wherein the first current sense circuit is configured to be activated when the over-frequency detector circuit indicates that the pulse repetition frequency has reached or exceeded the frequency threshold and is otherwise deactivated.

3. The circuit of claim 1, wherein the pulse repetition frequency depends on a difference between the error signal and the current sense signal.

4. The circuit of claim 1, wherein the integrator is configured to integrate a signal representing the difference between the error signal and the current sense signal.

5. The circuit of claim 1, wherein the integrator includes a capacitor configured to receive a difference current representing the difference between the error signal and the current sense signal.

6. The circuit of claim 1, wherein the oscillator circuit further includes a pulse generation circuit, which is coupled to the integrator downstream thereof and configured to generate a pulse of the switching signal in response to an output of the integrator exceeding a specific threshold value.

7. The circuit of claim 6, wherein the integrator is configured to be reset in response to each pulse of the switching signal.

8. The circuit of claim 1, wherein the pulse repetition frequency is limited to a maximum switching frequency.

9. The circuit of claim 8, wherein the switching controller further comprises:
   a duty cycle control circuit configured to modify—for pulse width modulation operation while the pulse repetition frequency equals the maximum switching frequency—an on-time of the switching signal dependent on the error signal.

10. The circuit of claim 9, wherein the duty cycle control circuit includes a flip-flop that is coupled to the oscillator circuit and configured to be set in response to each pulse and reset dependent on the error signal.

11. The circuit of claim 9, wherein the duty cycle control circuit is configured to modify the on-time of the switching signal dependent on the error signal and further dependent on the inductor current.

12. The circuit of claim 1,
    wherein the power conversion circuit includes a series circuit of a high-side switch and a low-side switch connected between an input terminal configured to receive the input voltage and a further terminal operably supplied with a reference potential, and
    wherein a common circuit node of the high-side switch and the low-side switch is coupled with the inductor, so that the inductor current is either sourced via the high-side switch or the low-side switch.

13. The circuit of claim 12, wherein the first current sense circuit is configured to sense a current passing through the low-side switch.

14. The circuit of claim 1,
    wherein the power conversion circuit includes a series circuit of a high-side switch and a low-side switch connected between an input terminal configured to receive the input voltage and a further terminal operably supplied with a reference potential,
    wherein a common circuit node of the high-side switch and the low-side switch is coupled with the inductor, so that the inductor current is either sourced via the high-side switch or the low-side switch,
    wherein the circuit further comprises a second current sense circuit configured to sense a current passing through the high-side switch and to generate a respective second current sense signal, and
    wherein the circuit further comprises a duty cycle control circuit configured to modify an on-time of the switching signal dependent on a difference between the error signal and the second current sense signal.

15. A method comprising:
    sensing an output voltage at a power conversion circuit and providing a respective voltage sense signal;
    sensing a current indicative of an inductor current passing through an inductor of the power conversion circuit and providing a respective current sense signal;
    determining an error signal based on the voltage sense signal and a reference voltage; and
    generating at least one pulse-frequency modulated switching signal using an oscillator that generates, for pulse frequency modulation operation of the power conversion circuit, the at least one pulse-frequency modulated switching signal as a sequence of pulses with a pulse repetition frequency that depends on the error signal and the current sense signal, wherein the oscillator integrates a signal depending on a difference between the error signal and the current sense signal until an integrated value of the signal reaches a threshold value after an integration time, the integration time determining the pulse repetition frequency.

16. The method of claim 15, further comprising:
    detecting when the pulse repetition frequency reaches or exceeds a frequency threshold,
    wherein the current sense signal is provided by a first current sense circuit which is activated in response to detecting that the pulse repetition frequency has reached or exceeded the frequency threshold and is otherwise deactivated.

17. The method of claim 15, wherein the pulse repetition frequency depends on a difference between the error signal and the current sense signal.

18. The method of claim 15, wherein the pulse repetition frequency is limited to a maximum value.

19. A method comprising:
sensing an output voltage at a power conversion circuit and providing a respective voltage sense signal;
sensing a current indicative of an inductor current passing through an inductor of the power conversion circuit and providing a respective current sense signal;
determining an error signal based on the voltage sense signal and a reference voltage;
generating at least one pulse-frequency modulated switching signal using an oscillator that generates, for pulse frequency modulation operation of the power conversion circuit, the at least one pulse-frequency modulated switching signal as a sequence of pulses with a pulse repetition frequency that depends on the error signal and the current sense signal; and
detecting when the pulse repetition frequency reaches or exceeds a frequency threshold, wherein the current sense signal is provided by a first current sense circuit which is activated in response to detecting that the pulse repetition frequency has reached or exceeded the frequency threshold and is otherwise deactivated.

* * * * *